US011183668B2

(12) United States Patent
Xia et al.

(10) Patent No.: US 11,183,668 B2
(45) Date of Patent: Nov. 23, 2021

(54) TOP-EMISSION TYPE MICRO CAVITY OLED DISPLAY DEVICE

(71) Applicant: SHANGHAI SEEO OPTRONICS TECHNOLOGY CO., LTD., Shanghai (CN)

(72) Inventors: Wanwan Xia, Shanghai (CN); Tieer Gu, Shanghai (CN); Dong Qian, Shanghai (CN); Bo Liu, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 48 days.

(21) Appl. No.: 16/728,048

(22) Filed: Dec. 27, 2019

(65) Prior Publication Data
US 2020/0144548 A1 May 7, 2020

Related U.S. Application Data

(63) Continuation-in-part of application No. PCT/CN2018/096546, filed on Jul. 21, 2018.

(30) Foreign Application Priority Data

Jul. 10, 2018 (CN) .......................... 201810747676.5

(51) Int. Cl.
H01L 51/52 (2006.01)
H01L 27/32 (2006.01)
H01L 51/50 (2006.01)

(52) U.S. Cl.
CPC ........ H01L 51/5265 (2013.01); H01L 27/322 (2013.01); H01L 27/3211 (2013.01);
(Continued)

(58) Field of Classification Search
CPC ............. H01L 51/5265; H01L 27/3211; H01L 27/322; H01L 51/5044
See application file for complete search history.

(56) References Cited

U.S. PATENT DOCUMENTS 5,949,187 A 9/1999 Xu et al.
8,304,977 B2 11/2012 Oda

FOREIGN PATENT DOCUMENTS

CN 102054936 A 5/2011
CN 103928495 A 7/2014
(Continued)

OTHER PUBLICATIONS

Search Report for PCT/CN2018/096546, dated Apr. 11, 2019.
Office Action issued in corresponding Chinese Patent Appln. No. 2018107476765, dated Apr. 24, 2020.

Primary Examiner — Anthony Ho
(74) Attorney, Agent, or Firm — Blue Filament Law PLLC

(57) ABSTRACT

The present invention provides a top-emission type micro cavity OLED display device, comprising: an array substrate; a reflection metal layer arranged on the array substrate; an anode modulation layer arranged on the reflection metal layer and made of a translucent conductive material; an organic light-emitting layer arranged on the anode modulation layer and not patterned; and a cathode layer arranged on the organic light-emitting layer. The top-emission type micro cavity OLED display device comprises a plurality of sub-pixels, and the anode modulation layer is divided into a plurality of anode modulation electrodes corresponding to the plurality of sub-pixels; the plurality of sub-pixels is at least classified into a first type sub-pixel, a second type sub-pixel and a third type sub-pixel; the first to third type sub-pixels display different colors, and the anode modulation electrodes corresponding to the first to third type sub-pixels have different thicknesses.

16 Claims, 6 Drawing Sheets

(52) U.S. Cl.
CPC ...... *H01L 51/5044* (2013.01); *H01L 51/5218* (2013.01); *H01L 51/5271* (2013.01); *H01L 2251/5315* (2013.01); *H01L 2251/558* (2013.01)

(56) References Cited

FOREIGN PATENT DOCUMENTS

| | | |
|---|---|---|
| CN | 104600097 A | 5/2015 |
| CN | 107275503 A | 10/2017 |
| CN | 107546248 A | 1/2018 |

TOP-EMISSION TYPE MICRO CAVITY OLED DISPLAY DEVICE

RELATED APPLICATIONS

This application is a continuation in part of PCT Application Serial Number PCT/CN2018/096546 filed Jul. 21, 2018 that in turn claims priority of Chinese Application Number 201810747676.5 filed Jul. 10, 2018; the contents of which are hereby incorporated by reference.

TECHNICAL FIELD

The present invention relates to the field of display, and in particular, to a top-emission type micro cavity OLED display device with good color displaying effect and low power consumption.

BACKGROUND

An organic light-emitting diode display device, referred to as an OLED display device, is a latest generation of display technology, and has advantages of fast response speed, small thickness, and bendability, etc. A full-color scheme of the OLED display device includes a method in which red, green, and blue sub-pixels are juxtaposed, that is, three kinds of light-emitting materials, red, green, and blue, are respectively formed on a substrate by patterning with a fine mask technology. However, as the market demands for a higher and higher screen resolution, a traditional fine mask technology cannot meet the high resolution requirements due to process limitations. Especially in recent years, with the rise of the micro head display market such as AR (Augmented Reality Technology)/VR (Virtual Reality Technology), etc., there comes higher requirements in the screen resolution. In response to this trend, a white light OLED matching a color filter layer appears.

The top-emission type micro cavity OLED display device achieves the full-color display effect mainly by means of a micro resonance cavity effect. The micro resonance cavity effect refers to an optical interference effect inside the OLED device, which has to prepare a half mirror that is semi-transparent and semi-reflective at a light exit of the device. When photons are emitted from a light-emitting layer, mutual interference occurs between a reflection anode and the half mirror, causing constructive or destructive interference. Only light with a certain wavelength is enhanced, and a part of light is weakened, so a full width at half maximum of a light wave also becomes narrower. The related art generally includes a strong micro cavity and a weak micro cavity. The strong micro cavity refers to a situation in which the micro cavity has a significant strengthening effect on a specific wavelength and the full width at half maximum is narrow when a cathode and an anode have a relatively high reflectivity. In contrast, the weak micro cavity refers to a situation in which the micro cavity has a non-significant strengthening effect on a specific wavelength and the full width at half maximum is wide when a cathode and an anode have a relatively low reflectivity.

The white light OLEDs used in the related art have two forms. In a first form, a top-emission type weak micro cavity white light OLED device matches a color filter layer, the white light OLED directly emits light of three colors, red, green and blue; red, green and blue sub-pixels each correspond to a filter layer above of the corresponding color through which undesired wavelength can be filtered out so as to achieve color displaying. In a second forms, a top-emission type strong micro cavity white light OLED device matches a color filter layer, three cavity lengths of red, green and blue are initially achieved by adjusting a thickness of an optical modulation layer of red, green and blue sub-pixels, the cavity lengths correspond to wavelengths of the emitted light in one-to-one correspondence, and finally color displaying is achieved based on three micro cavities and the color filter layers of corresponding colors, the optical modulation layer is the thickest for the red color, second thickest for the green color, and least thickest for the blue color. Compared with the first form, the second form has a larger color gamut and a purer color. However, for the top-emission type weak micro cavity white light OLED device matching a color filter layer, light of red, green and blue colors emitted from the weak micro cavity white light OLED cannot be perfectly selectively transmitted through the filter layer. Under normal circumstances, some stray light is transmitted. As shown in FIG. 1, which illustrates a red, green and blue spectrum after light emitted from a weak micro cavity white light OLED passes a color filter layer in the related art, the three curves respectively represent red, green and blue spectrums after the weak micro cavity white light OLED passes the color filter layer, a dotted line R represents a red light spectrum, a dotted line G represents a green light spectrum, and a dotted line B represents a blue light spectrum. Taking the green light spectrum as an example, in addition to transmission of the 550 nm main band, the 460 nm blue light is not suppressed, as a result, the color has a reduced purity, greatly reducing a color gamut of the display. For the top-emission type strong micro cavity white light OLED device matching a color filter layer, the strong micro cavity white light OLED can effectively solve a problem of impure color, but there is still some energy loss after the color filter layer is passed. Therefore, how to ensure purity of the color and improve utilization of the energy while reducing the power consumption of the display is a problem to be solved by the present invention.

SUMMARY

The present invention provides a top-emission type micro cavity OLED display device, comprising: an array substrate, a reflection metal layer arranged on the array substrate, an anode modulation layer arranged on the reflection metal layer, an organic light-emitting layer arranged on the anode modulation layer, and a cathode layer arranged on the organic light-emitting layer; wherein the organic light-emitting layer is not patterned, and the anode modulation layer is a translucent conductive material; wherein the top-emission type micro cavity OLED display device comprises a plurality of sub-pixels, and the anode modulation layer is divided into a plurality of anode modulation electrodes corresponding to the plurality of sub-pixels; the plurality of sub-pixels is at least classified into a first type sub-pixel, a second type sub-pixel and a third type sub-pixel; the first type sub-pixel, the second type sub-pixel, and the third type sub-pixel display different colors, and the anode modulation electrodes corresponding to the first type sub-pixel, the second type sub-pixel, and the third type sub-pixel have different thicknesses.

Optionally, the first type sub-pixel displays a red color, the second type sub-pixel displays a green color, and the third type sub-pixel displays a blue color; a thickness of the anode modulation electrode corresponding to the first type sub-pixel is greater than a thickness of the anode modulation electrode corresponding to the second type sub-pixel, and the thickness of the anode modulation electrode corresponding to the second type sub-pixel is greater than a thickness of the anode modulation electrode corresponding to the third type sub-pixel.

Optionally, a sum of a thickness of the organic light-emitting layer corresponding to the first type sub-pixel and the thickness of the anode modulation electrode corresponding to the first type sub-pixel is within a range of 290-310 nm, a sum of a thickness of the organic light-emitting layer corresponding to the second type sub-pixel and the thickness of the anode modulation electrode corresponding to the second type sub-pixel is within a range of 240-260 nm, and a sum of a thickness of the organic light-emitting layer corresponding to the third type sub-pixel and the thickness of the anode modulation electrode corresponding to the third type sub-pixel is within a range of 190-210 nm.

Optionally, the thickness of the anode modulation electrode corresponding to the first type sub-pixel is within a range of 110-125 nm, the thickness of the anode modulation electrode corresponding to the second type sub-pixel is within a range of 65-75 nm, and the thickness of the anode modulation electrode corresponding to the third type sub-pixel is within a range of 18-25 nm.

Optionally, the organic light-emitting layer comprises a first hole transport layer, a blue organic light-emitting material layer, a first electron transport layer, a second hole transport layer, a red-green organic light-emitting material layer, and a second electron transport layer that are sequentially arranged on the anode modulation layer.

Optionally, a thickness of the first hole transport layer is within a range of 10-30 nm, a thickness of the blue organic light-emitting material layer is within a range of 20-35 nm, a sum of a thickness of the first electron transport layer and a thickness of the second hole transport layer is within a range of 50-60 nm, a thickness of the red-green organic light-emitting material layer is within a range of 25-35 nm, a thickness of the second electron transport layer is within a range of 30-50 nm; refractive indexes of the first hole transport layer, the blue organic light-emitting material layer, the first electron transport layer, the second hole transport layer, the red-green organic light-emitting material layer, and the second electron transport layer are within a range of 1.7-1.9.

Optionally, a red filter layer is correspondingly provided on the first type sub-pixel.

Optionally, a material of the anode modulation layer is indium tin oxide.

The present invention provides a top-emission type micro cavity OLED display device, comprising: an array substrate, a reflection anode layer arranged on the array substrate, a micro cavity modulation layer arranged on the reflection anode layer, an organic light-emitting layer arranged on the micro cavity modulation layer, and a cathode layer arranged on the organic light-emitting layer; wherein the organic light-emitting layer is not patterned, wherein the top-emission type micro cavity OLED display device comprises a plurality of sub-pixels, and the plurality of sub-pixels is at least classified into a first type sub-pixel, a second type sub-pixel and a third type sub-pixel; the first type sub-pixel displays a red color, the second type sub-pixel displays a green color, and the third type sub-pixel displays a blue color; the micro cavity modulation layer has different thicknesses corresponding to the first type sub-pixel, the second type sub-pixel, and the third type sub-pixel; and a sum of a thickness of the organic light-emitting layer corresponding to the first type sub-pixel and a thickness of the micro cavity modulation layer corresponding to the first type sub-pixel is within a range of 290-310 nm, a sum of a thickness of the organic light-emitting layer corresponding to the second type sub-pixel and a thickness of the micro cavity modulation layer corresponding to the second type sub-pixel is within a range of 240-260 nm, and a sum of a thickness of the organic light-emitting layer corresponding to the third type sub-pixel and a thickness of the micro cavity modulation layer corresponding to the third type sub-pixel is within a range of 190-210 nm.

Optionally, the thickness of the micro cavity modulation layer corresponding to the first type sub-pixel is within a range of 110-125 nm, the thickness of the micro cavity modulation layer corresponding to the second type sub-pixel is within a range of 65-75 nm, and the thickness of the micro cavity modulation layer corresponding to the third type sub-pixel is within a range of 18-25 nm.

Optionally, the organic light-emitting layer comprises a first hole transport layer, a blue organic light-emitting material layer, a first electron transport layer, a second hole transport layer, a red-green organic light-emitting material layer, and a second electron transport layer that are sequentially arranged on the micro cavity modulation layer.

Optionally, a thickness of the first hole transport layer is within a range of 10-30 nm, a thickness of the blue organic light-emitting material layer is within a range of 20-35 nm, a sum of a thickness of the first electron transport layer and a thickness of the second hole transport layer is within a range of 50-60 nm, a thickness of the red-green organic light-emitting material layer is within a range of 25-35 nm, and a thickness of the second electron transport layer is within a range of 30-50 nm; and refractive indexes of the first hole transport layer, the blue organic light-emitting material layer, the first electron transport layer, the second hole transport layer, the red-green organic light-emitting material layer, and the second electron transport layer are within a range of 1.7 to 1.9.

Optionally, a red filter layer is correspondingly provided on the first type sub-pixel.

A top-emission type micro cavity OLED display device of the invention includes: an array substrate, a reflection layer arranged on the array substrate, an anode layer arranged on the reflection layer, a micro cavity modulation layer arranged on the anode layer, an organic light-emitting layer arranged on the micro cavity modulation layer, and a cathode layer arranged on the organic light-emitting layer; wherein the organic light-emitting layer is not patterned and the organic light-emitting layer comprises a plurality of layers; wherein the top-emission type micro cavity OLED display device comprises a plurality of sub-pixels, and the plurality of sub-pixels is at least classified into a first type sub-pixel, a second type sub-pixel, and a third type sub-pixel; and the first type sub-pixel displays red light, the second type sub-pixel displays green light, the third type sub-pixel displays blue light, and the micro cavity modulation layer has different thicknesses corresponding to the first type sub-pixel, the second type sub-pixel, and the third type sub-pixel; wherein wavelengths of light emitted by the first type sub-pixel, light emitted by the second type sub-pixel, and light emitted by the third type sub-pixel satisfy the following formula: $\Sigma 2 n_i d_i + \delta_k = k\lambda$; and wherein $n_i$ is a refractive index of a material of an $i^{th}$ layer of the plurality of layers of the organic light-emitting layer and the micro cavity modulation layer; $d_i$ is a thickness of the $i^{th}$ layer of the plurality of layers of the organic light-emitting layer and the micro cavity modulation layer; $\delta_k$ is a metal phase shift; and k is 1, 2, or 3.

Optionally, the reflection layer and the anode layer are of a same layer that is made of a metal reflective material.

Optionally, the anode layer and the micro cavity modulation layer are of a same layer that is made of a translucent conductive material.

For the top-emission type micro cavity OLED display device provided by the present invention, the organic light-emitting material layer is a non-patterned continuous full-surface structure, which achieves color displaying by setting cavity lengths of micro cavities of different sub-pixels. Compared with a juxtaposition method of red, green and blue sub-pixels in the related art, since the fine mask technology is not required for patterning the red, green, and blue light-emitting materials to be formed on the substrate, it is not limited by the fine mask technology, and thus a display effect of a higher resolution can be achieved. In addition, the present invention is based on the principle of multi-beam interference of the micro cavity, by setting a layer thickness and a material reflectivity in the micro cavity, the output intensity and color purity of the red, green and blue light can be increased, thereby providing an excellent color display effect. Moreover, the top-emission type micro cavity OLED display device provided by the present invention may not be provided with a color filter layer, and has advantages of low power consumption and high efficiency. Furthermore, the top-emission type micro cavity OLED display device provided by the present invention may further include an anode modulation layer that functions to provide holes while serving as an optical modulation layer, and the anode modulation layer functions as both an anode of the sub-pixels and an optical modulation layer of the sub-pixels, and thus a structure thereof is simple.

DESCRIPTION OF EMBODIMENTS

Figure 1:
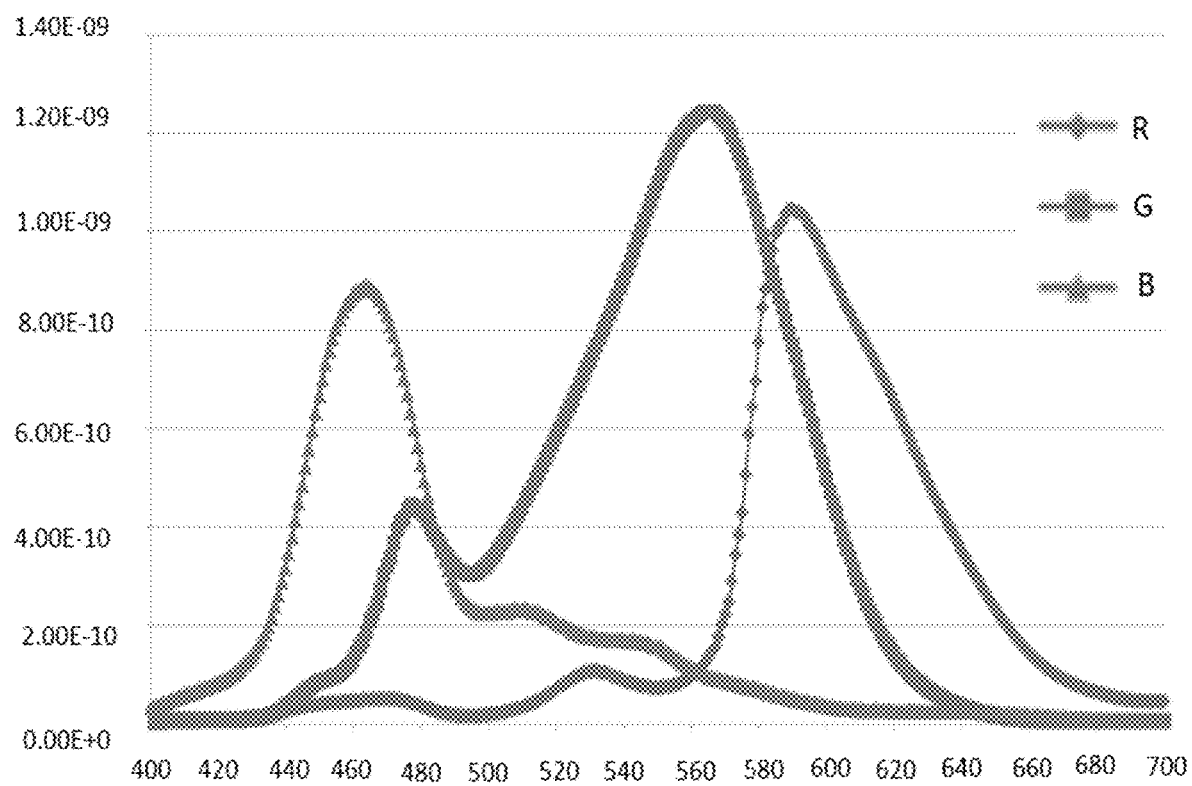
FIG. 1 illustrates red, green and blue light spectrums after light emitted from a weak micro cavity white light OLED passes through a color filter layer in the related art.

Exemplary embodiments will now be described more comprehensively with reference to the accompanying drawings. However, the exemplary embodiments can be implemented in various manners and should not be construed as being limited to the examples set forth herein; rather, these embodiments are provided to make the present invention more comprehensive and complete, and fully convey the concepts thereof to those skilled in the art. Furthermore, the described features, structures, or characteristics may be combined into one or more embodiments by means of any suitable manner. In the following description, numerous specific details are set forth for full understanding of the embodiments of the present invention. However, it should be understood by those skilled in the art that the technical solution of the present invention may be practiced without one or more of the specific details, or other methods, components, devices, steps, etc. may be employed. In other cases, well-known methods, devices, implementations, or operations are not shown or described in details so as to avoid obscuring aspects of the present invention. The diagrams shown in the drawings are merely illustrative, and do not have to include all contents and operations/steps therein or to be performed in the exact order described. For example, some operations/steps may be decomposed while some operations/steps may be merged, partially merged, or adjusted, and therefore the actual performing order may vary depending on the actual situation.

Embodiment 1

Figure 2:
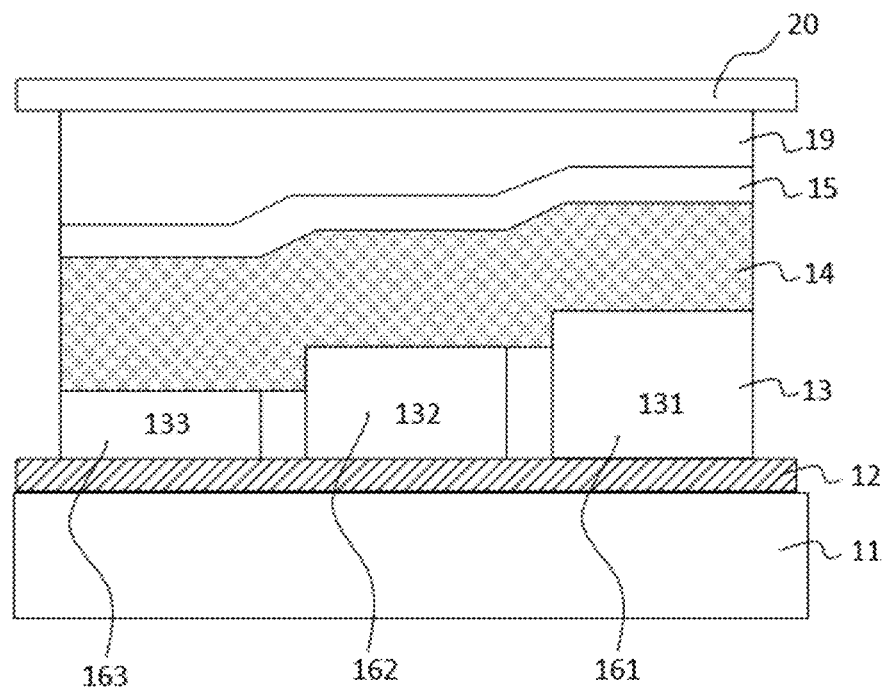
FIG. 2 is a schematic diagram of a top-emission type micro cavity OLED display device according to Embodiment 1 of the present invention.

FIG. 2 is a schematic diagram of a top-emission type micro cavity OLED display device according to Embodiment 1 of the present invention. The top-emission type micro cavity OLED display device includes: an array substrate 11; a reflection metal layer 12 arranged on the array substrate 11; an anode modulation layer 13 arranged on the reflection metal layer 12 and made of a translucent conductive material; an organic light-emitting layer 14 that is arranged on the anode modulation layer 13 and is not patterned, that is, the organic light-emitting layer 14 being formed as a continuous full-surface layer structure on the anode modulation layer 13; a cathode layer 15 arranged on the organic light-emitting layer 14; a planarization layer 19 arranged on the cathode layer 15; and an encapsulation layer 20 arranged on the planarization layer 19.

The top-emission type micro cavity OLED display device includes a plurality of sub-pixels 16, and the anode modulation layer 13 is divided into a plurality of anode modulation electrodes corresponding to the plurality of sub-pixels 16. The plurality of sub-pixels 16 is at least classified into a first type sub-pixel 161, a second type sub-pixel 162, and a third type sub-pixel 163. The first type sub-pixel 161, the second type sub-pixel 162, and the third type sub-pixel 163 display different colors. The anode modulation electrodes 13 corresponding to the first type sub-pixel 161, the second type sub-pixel 162, and the third type sub-pixel 163 have different thicknesses.

As described in the background, the top-emission type micro cavity OLED display device achieves a full-color display effect mainly through a micro resonance cavity effect, and the micro resonance cavity effect refers to the optical interference effect inside the OLED device. Light-emitting properties of the micro resonance cavity can be determined by an optical length of the micro resonance cavity and is related to a thickness and refractive index of the material of each layer. Generally, it is necessary to incorporate an optical length control layer of a different thickness to perform adjusting. The optical length control layer is generally referred to as an optical modulation layer. In the related art, a material of the optical modulation layer is generally an ITO thin film, an IZO thin film, an AZO thin film or an organic material thin film, etc., the optical modulation layer is arranged above the anode, and the optical modulation layer and the anode are two separate layer structures.

In Embodiment 1 of the present invention, the anode modulation layer 13 having different thicknesses corresponding to different types of sub-pixels is arranged, and the anode modulation layer 13 functions as both an anode of the sub-pixel and an optical modulation layer of the sub-pixel, to drive the organic light-emitting layer 14 to display and adjust the optical length. Specifically, the material of the anode modulation layer 13 is indium tin oxide, which is a material having a high work function. The anode functions only as an electrode for supplying holes when driving the organic light-emitting layer, and thus the indium tin oxide having a high work function of 4.5 eV-5.3 eV functioning as the anode modulation layer 13 completely satisfies the function as the anode. On the other hand, the reflection metal layer 12 is arranged under the anode modulation layer 13, and light beams emitted from the organic light-emitting layer 14 interfere with each other between the reflection metal layer 12 and the translucent cathode layer 15, causing constructive or destructive interference and forming different optical path lengths between the reflection metal layer 12 and the translucent cathode layer 15. The material of the anode modulation layer 13 is translucent indium tin oxide, which can allow light emitted from the organic light-emitting layer 14 to be transmitted to the reflection metal layer 12 or to the cathode layer 15. Besides, the anode modulation layer 13 have different thicknesses corresponding to different types of sub-pixels and can be used as an optical modulation layer. In Embodiment 1 of the present invention, the anode modulation layer 13 having different thicknesses corresponding to different types of sub-pixels functions as both the anode of the sub-pixel and the optical modulation layer of the sub-pixel, and thus a structure thereof is simple.

Optionally, in Embodiment 1 of the present invention, the first type sub-pixel 161 displays a red color, the second type sub-pixel 162 displays a green color, and the third type sub-pixel 163 displays a blue color. A thickness of the anode modulation electrode 131 corresponding to the first type sub-pixel 161 is greater than a thickness of the anode modulation electrode 132 corresponding to the second type sub-pixel 162, and the thickness of the anode modulation electrode 132 corresponding to the second type sub-pixel 162 is greater than a thickness of the anode modulation electrode 133 corresponding to the third type sub-pixel 163. In Embodiment 1 of the present invention, the optical path length is adjusted in a manner that anode modulation electrodes 13 having different thicknesses are provided to correspond to different types of sub-pixels.

The micro cavity is based on a principle of multi-beam interference, and an enhanced output of a wavelength of the micro cavity can be achieved when a cavity length and the wavelength of the micro cavity satisfy a condition of constructive interference, specifically, satisfying the following formula (1):

$$\Sigma 2n_i d_i \delta_k = k\lambda (k=1,2,3) \qquad \text{formula (1)}$$

where $n_i$ is a refractive index of an $i^{th}$ layer of material; $d_i$ is a thickness of the $i^{th}$ layer of material; $\delta_k$ is a metal phase shift, which is generally equivalent to an 20 nm equivalent penetration depth of the metal; and $2n_i d_i$ is the above-mentioned cavity length of the micro cavity.

Figure 3:
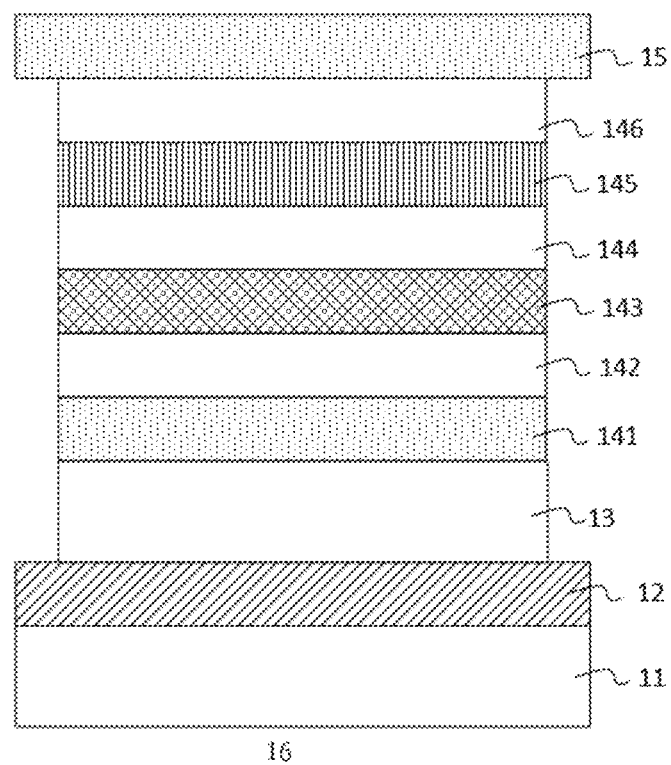
FIG. 3 is a structural schematic view of respective layers of the top-emission type micro cavity OLED according to Embodiment 1.

As a specific embodiment, Embodiment 1 of the present invention provides a specific layer structure and thickness of a top-emission type micro cavity OLED. FIG. 3 is a structural schematic view of respective layers of a top-emission type micro cavity OLED according to Embodiment 1 of the present invention. With reference to FIG. 3, each type of sub-pixels of the top-emission type micro cavity OLED display device is configured to emit light of a different color, and each sub-pixel 16 includes: a reflection metal layer 12 arranged on an array substrate 11, an anode modulation layer 13 arranged on the reflection metal layer 12, an organic light-emitting layer 14 arranged on the anode modulation layer 13, and a cathode layer 15 arranged on the organic light-emitting layer 14. The cavity length of the micro cavity of the sub-pixel 16 is related to a layer thickness and refractive indexes of materials between the reflection metal layer 12 and the cathode layer 15, that is, the cavity length of the micro cavity of the sub-pixel 16 is related to the layer thickness and the refractive indexes of the materials of the organic light-emitting layer 14 and the anode modulation layer 13. Optionally, in Embodiment 1 of the present invention, a sum of a thickness of the organic light-emitting layer 14 corresponding to the first type sub-pixel 161 and a thickness of its corresponding anode modulation electrode 131 is within a range of 290-310 nm, a sum of a thickness of the organic light-emitting layer 14 corresponding to the second type sub-pixel 162 and a thickness of its corresponding anode modulation electrode 132 is within a range of 240-260 nm, and a sum of a thickness of the organic light-emitting layer 14 corresponding to the third type sub-pixel 163 and its corresponding anode modulation electrode 133 is within a range of 190-210 nm.

The organic light-emitting layer 14 includes a first hole transport layer 141, a blue organic light-emitting material layer 142, a first electron transport layer 143, a second hole transport layer 144, a red-green organic light-emitting material layer 145, and a second electron transport layer 146 that are sequentially arranged on the anode modulation layer 13. Optionally, a thickness of the first hole transport layer 141 is set to be within a range of 10-30 nm. A light-emitting material of the blue organic light-emitting material layer 142 is a fluorescent material, which is a host doped with a guest material and has a thickness within a range of 20-35 nm. The red-green organic light-emitting material layer 145 is further arranged above the blue organic light-emitting material layer 142, and the red-green organic light-emitting material layer 145 may be a host doped with a red-green guest dye material, but alternatively, may also be a host doped with a yellow light material. Or, of course, the red-green organic light-emitting material layer 145 may adopt double light-emitting layers, and the red-green light-emitting layers are separated by a thin buffer layer. A total thickness of the red-green organic light-emitting material layer 145 is within a range of 25-35 nm. The first electron transport layer 143 and the second hole transport layer 144, which function as a PN junction connection, are arranged between the blue organic light-emitting material layer 142 and the red-green organic light-emitting material layer 145, and a total thickness thereof is within a range of 50-60 nm, and a refractive index thereof is within a range of 1.7 to 1.9. The second electron transport layer 146 is arranged between the red-green organic light-emitting material layer 145 and the cathode layer 15, and a thickness thereof is within a range of 30-50 nm. The above-mentioned organic materials are highly transparent materials having very small extinction coefficients, their refractive indexes are all within a range of 1.7 to 2.0, and a transmittance thereof is more than 98% in a visible light area. Meanwhile, a thickness of the anode modulation electrode 131 corresponding to the first type sub-pixel is within a range of 110-125 nm, a thickness of the anode modulation electrode 132 corresponding to the second type sub-pixel is within a range of 65-75 nm, and a thickness of the anode modulation electrode 133 corresponding to the third type sub-pixel is within a range of 18-25 nm.

Figure 4:
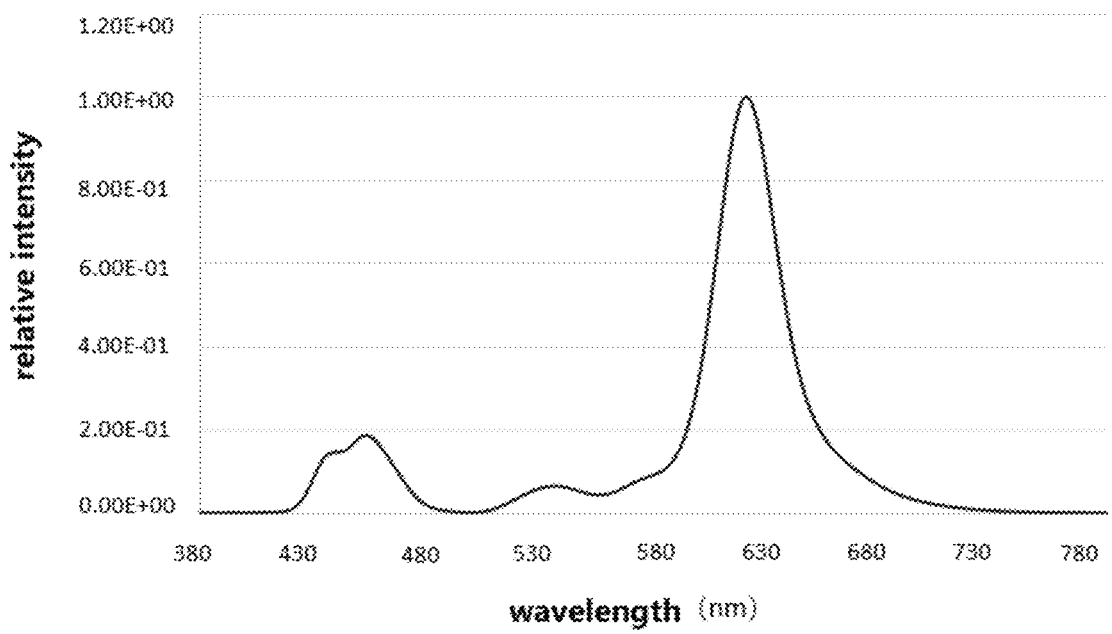
FIG. 4 is an optical spectrum of a red sub-pixel.
Figure 5:
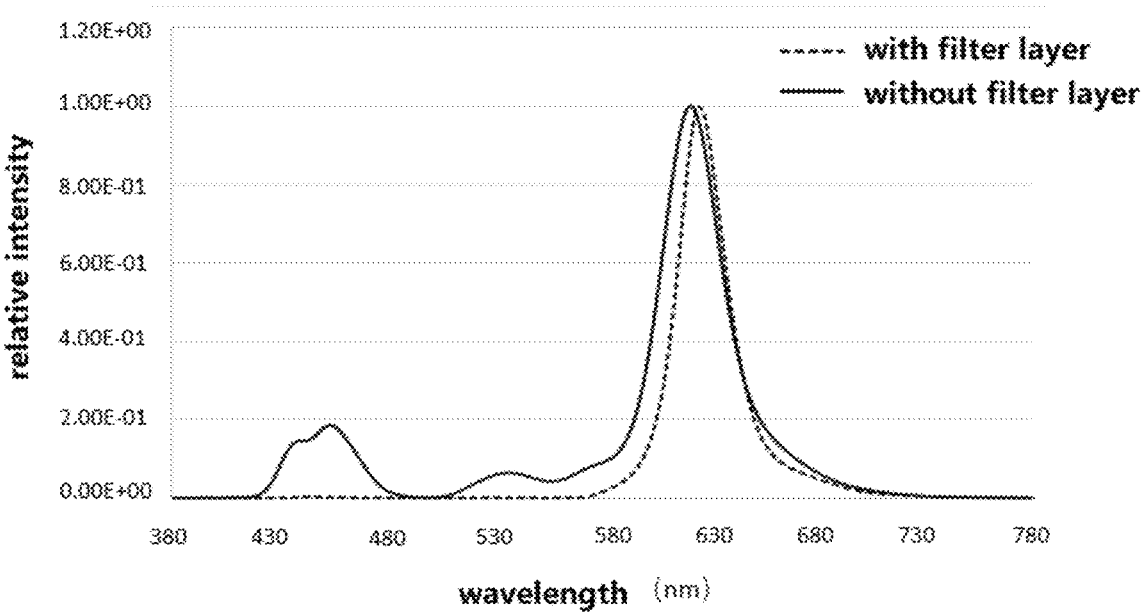
FIG. 5 illustrates a comparison between a spectrum of a red sub-pixel collaborating with a filter layer and a spectrum of a red sub-pixel not collaborating with a filter layer.

The thicknesses and the refractive indexes of the materials of the above-mentioned layers are put into the formula (1). For the first type sub-pixel 161, that is, the sub-pixel displaying the red color, an enhanced output of light of approximately 620 nm and 410 nm can be obtained. A certain error exists between a calculated result and the actual result, but this error is within a reasonable range. Referring to FIG. 4, which is an optical spectrum of light emitted from a micro cavity structure of the first type sub-pixel 161, an enhanced output of light of approximately 620 nm and 410 nm is obtained. The light of approximately 620 nm is red light. Compared with a light intensity distribution diagram shown in FIG. 1, light emitted from the red sub-pixel is more concentrated at a range of approximately 620 nm, stray light of other wavelengths is greatly suppressed, and the color purity is increased. However, as shown in the figure, increased light is present in the blue light region of approximately 410 nm. Optionally, in order to allow the sub-pixel displaying the red color to have a higher color purity, a red filter layer may be arranged on the sub-pixel displaying the red color, and specifically, it may be arranged above the cathode layer 15, above or below the planarization layer 19. FIG. 5 illustrates a comparison between an optical spectrum of a red sub-pixel collaborating with a filter layer and an optical spectrum of a red sub-pixel not collaborating with a filter layer, where the solid line represents a spectral curve collaborating with a filter layer, and the dotted line represents a spectral curve not collaborating with a filter layer. As shown in the figure, in the structure collaborating with the filter layer, a blue light region of approximately 410 nm is filtered out by the red filter layer, thereby displaying a purer red color.

Figure 6:
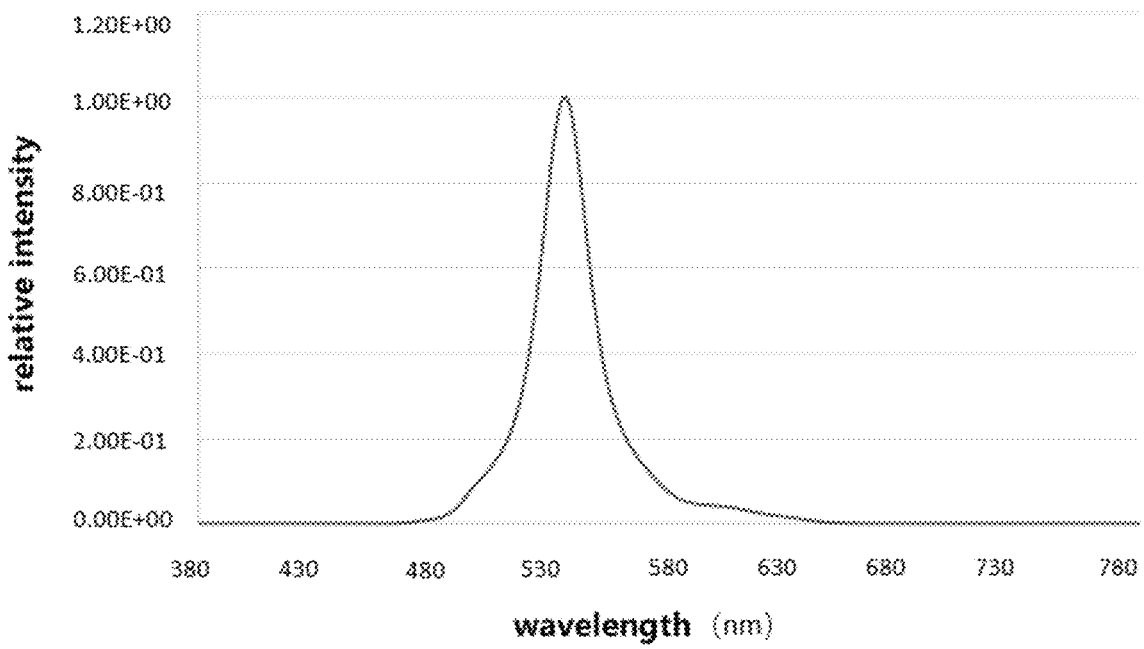
FIG. 6 is an optical spectrum of a green sub-pixel.
Figure 7:
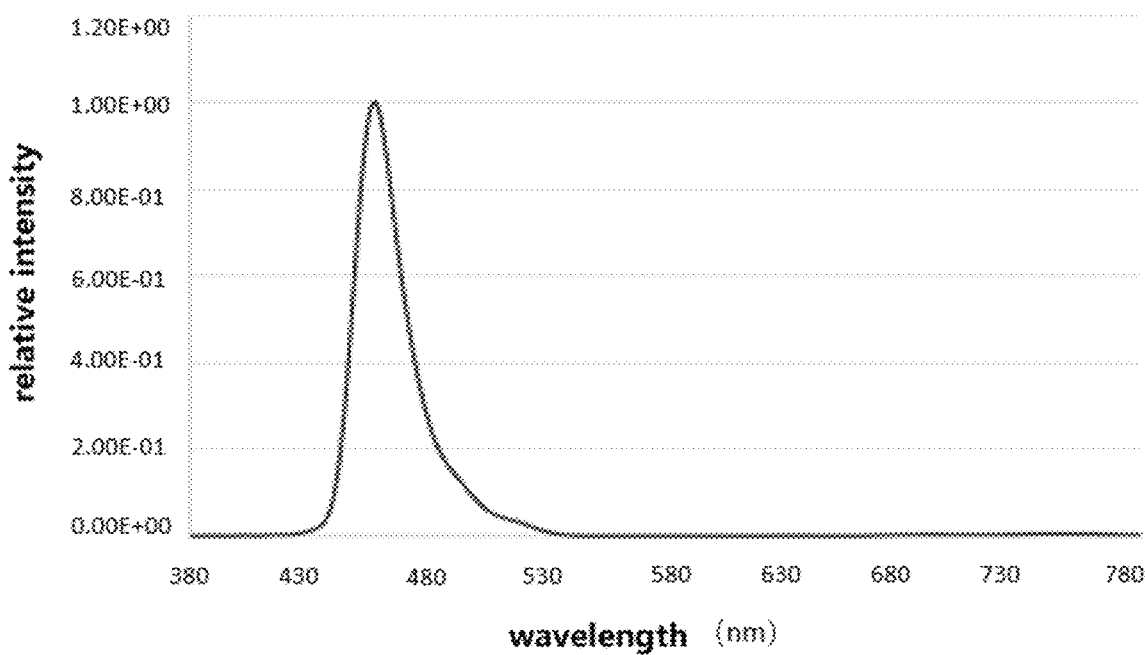
FIG. 7 is an optical spectrum of a blue sub-pixel.

For the second type sub-pixel 162, that is, the sub-pixel displaying the green color, according to the formula (1), an enhanced output of light of approximately 530 nm can be obtained. Referring to FIG. 6, which is an optical spectrum of light emitted from a micro cavity structure of the second type sub-pixel 162, an enhanced output of light of approximately 530 nm is obtained. The light of approximately 530 nm is green light. Compared with the light intensity distribution diagram shown in FIG. 1, light emitted from the green sub-pixel is more concentrated at a range of approximately 530 nm, a spectrum thereof is smooth without stray peaks, stray light of other wavelengths is greatly suppressed, and the color purity thereof is increased. Similarly, for the third type sub-pixel 163, that is, the sub-pixel displaying the blue color, according to the formula (1), an enhanced output of light of approximately 460 nm can be obtained. Referring to FIG. 7, which is an optical spectrum of light emitted from a micro cavity structure of the third type sub-pixel 163, an enhanced output of light of approximately 460 nm is obtained. The light of approximately 460 nm is blue light. Compared with the light intensity distribution diagram shown in FIG. 1, light emitted from the blue sub-pixel is more concentrated at a range of approximately 460 nm, a spectrum thereof is smooth without stray peaks, stray light of other wavelengths is greatly suppressed, and the color purity thereof is increased.

Figure 8:
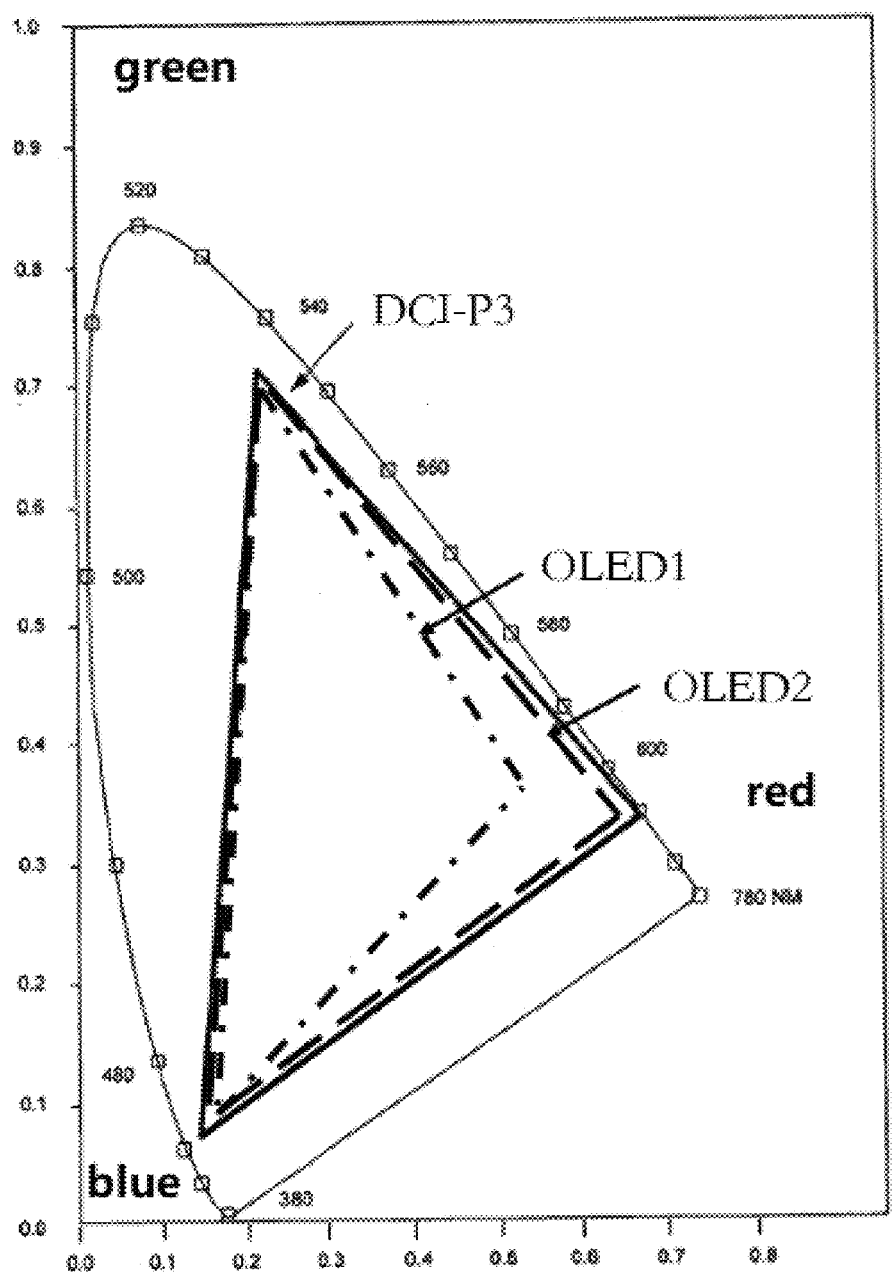
FIG. 8 is a schematic diagram illustrating representation of colors displayed by a top-emission type micro cavity OLED display device according to Embodiment 1 of the present invention in a 1931-CIE chromaticity diagram.

FIG. 8 is a schematic diagram illustrating representation of colors displayed by a top-emission type micro cavity OLED display device according to Embodiment 1 of the present invention in a 1931-CIE chromaticity diagram. In FIG. 8, DCI-P3 is a color gamut standard for unified shared coding of the color film industry. The range OLED1 is a color distribution displayed by the above-mentioned top-emission type micro cavity OLED display device without the red color filter. The range OLED2 is a color distribution displayed by the above-mentioned top-emission type micro cavity OLED display device with an addition of a red color filter on the first type sub-pixel. As shown in the figure, the range OLED1 can also achieve the color gamut specification, but a saturation of red light is relatively poor, and the color gamut is 70% DCI-P3; a saturation of red light of the range OLED2 is greatly improved, and it can display more excellent display effect.

For the top-emission type micro cavity OLED display device provided by Embodiment 1 of the present invention, the organic light-emitting material layer is non-patterned continuous full-surface structure, and color displaying is achieved by setting cavity lengths of micro cavities of different sub-pixels. Compared with the related art in which red, green and blue sub-pixels are juxtaposed, since a fine mask technology is not required for patterning the red, green, and blue light-emitting materials to be formed on the substrate, it is not limited by the fine mask technology, and thus a display effect of a higher resolution can be achieved. Moreover, Embodiment 1 of the present invention is based on the principle of multi-beam interference of the micro cavity, by setting a layer thickness and a material reflectivity in the micro cavity, the output intensities and color purities of the red, green and blue light can be increased, and an excellent color display effect can be achieved.

Please refer to Table 1, which illustrates comparison of items between the top-emission type micro cavity OLED display device provided by Embodiment 1 of the present invention and an OLED display device in the related art in which a sub-pixel of each color collaborates with a color filter layer. For the sake of convenience, item values in the related art are set to be comparison reference values, all of which are 1 except for chromaticity coordinates.

TABLE 1

| Comparison item | Device | Mode | Relative value of power consumption | Relative value of efficiency | Chromaticity coordinate | |
|---|---|---|---|---|---|---|
| | | | | | CIE_x | CIE_y |
| Related art | R | with filter layer | | 1 | 0.686 | 0.314 |
| | G | with filter layer | | 1 | 0.268 | 0.697 |
| | B | with filter layer | | 1 | 0.139 | 0.052 |
| | white image | with filter layer | 1 | | 0.312 | 0.329 |
| Solution of the present invention | R | without filter layer | | 1.5 | 0.534 | 0.291 |
| | G | without filter layer | | 1.1 | 0.257 | 0.7 |
| | B | without filter layer | | 1.35 | 0.138 | 0.058 |
| | white image | without filter layer | 0.7 | | 0.312 | 0.329 |

As shown in Table 1, because the related art uses the color filter, the chromaticity coordinate axis value is larger, and the displayed color purity is higher. However, the solution of the present invention does not use the filter layer, the light transmittance is improved, and the color gamut specification can also be achieved. Under a same power consumption, the relative values of efficiency are greatly increased and are all increased by 10% or more than the related art, and the relative value of efficiency of the R (red) device is even 1.5 times that of the related art. In a case of displaying a white image, the relative value of power consumption of the solution of the present invention is 0.7, which is 30% lower than the relative value 1 of power consumption of the related art. Therefore, it can be seen that the technical solution of the present invention has advantages of a low power consumption and a high efficiency compared with the related art.

Embodiment 2

Figure 9:
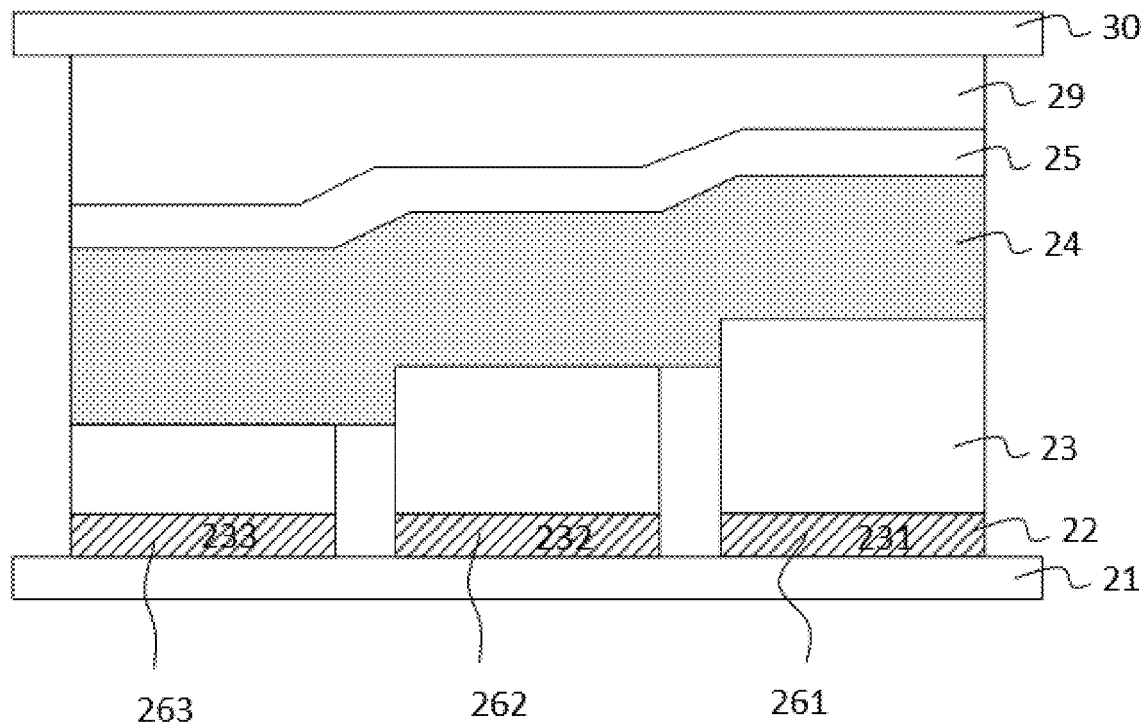
FIG. 9 is a schematic diagram of a top-emission type micro cavity OLED display device according to Embodiment 2 of the present invention.

FIG. 9 illustrates a top-emission type micro cavity OLED display device according to Embodiment 2 of the present invention. The top-emission type micro cavity OLED display device includes: an array substrate 21; a reflection anode layer 22 arranged on the array substrate 21; a micro cavity modulation layer 23 arranged on the reflection anode layer 22; an organic light-emitting layer 24 arranged on the micro cavity modulation layer 23, the organic light-emitting layer 24 being not patterned, that is, the organic light-emitting layer 24 being formed as a continuous full-surface layer structure on the micro cavity modulation layer 23; a cathode layer 25 arranged on the organic light-emitting layer 24; a flat layer 29 arranged on the cathode layer 25, and an encapsulation layer 30 arranged on the flat layer 29.

The top-emission type micro cavity OLED display device includes a plurality of sub-pixels 26, the reflection anode layer 22 is divided into a plurality of reflection anode electrodes corresponding to the plurality of sub-pixels, and the plurality of reflection anode electrodes has the same thickness. The plurality of sub-pixels 26 is at least classified into a first type sub-pixel 261, a second type sub-pixel 262, and a third type sub-pixel 263. The first type sub-pixel 261 displays a red color, the second type sub-pixel 262 displays a green color, and the third type sub-pixel 263 displays a blue color.

Unlike Embodiment 1, in Embodiment 2, the reflection anode layer 22 and the micro cavity modulation layer 23 are separate layers, the reflection anode layer 22 is configured to drive the organic light emitting displaying, and forms a micro cavity of the optical interference effect inside the OLED device together with the cathode layer 25; the micro cavity modulation layer 23 is configured to modulate optical lengths in sub-pixels of different colors, and a material of the micro cavity modulation layer 23 is generally an ITO film, an IZO film, an AZO film, or an organic material film, etc.

Under the structure of Embodiment 2, the micro cavity is based on the principle of multi-beam interference. When a cavity length of the micro cavity and the wavelength satisfy a condition of constructive interference, an enhanced output of the wavelength can also be achieved.

Figure 10:
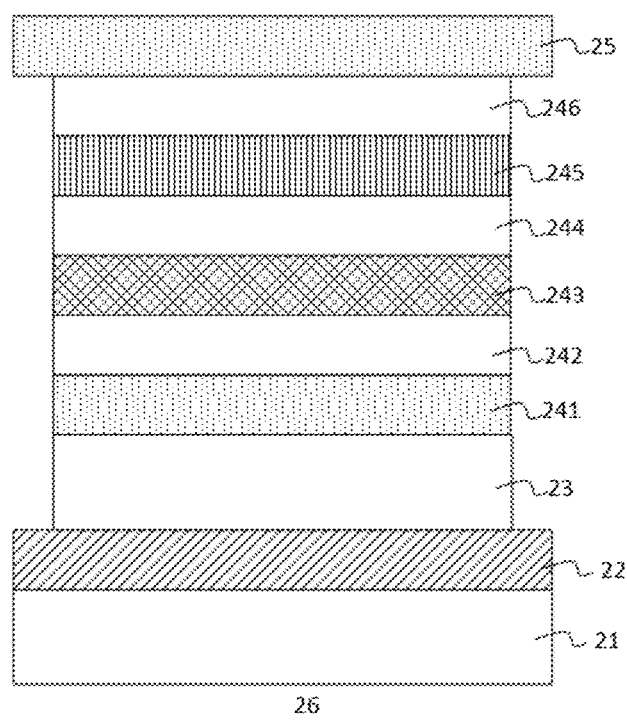
FIG. 10 is a structural schematic view of respective layers of a top-emission type micro cavity OLED according to Embodiment 2 of the present invention.

As a specific embodiment, Embodiment 2 of the present invention provides a specific layer structure of a top-emission type micro cavity OLED. Please refer to FIG. 10, which is a structural schematic view of respective layers of a top-emission type micro cavity OLED according to Embodiment 2 of the present invention. Each type of sub-pixels of the top-emission type micro cavity OLED display device is configured to emit light of a different color, and each sub-pixel 26 includes: an array substrate 21; a reflection anode layer 22 arranged on the array substrate 21, a micro cavity modulation layer 23 arranged on the reflection anode layer 22, an organic light-emitting layer 24 arranged on the micro cavity modulation layer 23, and a cathode layer 25 arranged on the organic light-emitting layer 24. The cavity length of the micro cavity of the sub-pixel 26 is related to layer thicknesses and refractive indexes of the materials between the reflection anode layer 22 and the cathode layer 25, that is, the cavity length of the micro cavity of the sub-pixel 26 is related to layer thicknesses and refractive indexes of the materials of the organic light-emitting layer 24 and the micro cavity modulation layer 23. Optionally, a sum of a thickness of the organic light-emitting layer 24 corresponding to the first type sub-pixel 261 and a thickness of its corresponding micro cavity modulation layer 231 is within a range of 290-310 nm, a sum of a thickness of the organic light-emitting layer 24 corresponding to the second type sub-pixel 262 and a thickness of its corresponding micro cavity modulation layer 232 is within a range of 240-260 nm, and a sum of a thickness of the organic light-emitting layer 24 corresponding to the third type sub-pixel 263 and its corresponding micro cavity modulation layer 233 is within a range of 190-210 nm.

The organic light-emitting layer 24 includes a first hole transport layer 241, a blue organic light-emitting material layer 242, a first electron transport layer 243, a second hole transport layer 244, a red-green organic light-emitting material layer 245, and a second electron transport layer 246 that are sequentially arranged on the micro cavity modulation layer 23. Optionally, a thickness of the first hole transport layer 241 is set to be within a range of 10-30 nm. A light-emitting material of the blue organic light-emitting material layer 242 is a fluorescent material, which is a host doped with a guest material and has a thickness within a range of 20-35 nm. The red-green organic light-emitting material layer 245 is further arranged above the blue organic light-emitting material layer 242, the red-green organic light-emitting material layer 245 may be a host doped with a red-green guest dye material, or alternatively, may be a host doped with a yellow light material, or of course, may adopt double light-emitting layers with a thin buffer layer separating the red-green light-emitting layers, and a total thickness of the red-green organic light-emitting material layer 245 is within a range of 25-35 nm. The first electron transport layer 243 and the second hole transport layer 244, which function as a PN junction connection, are arranged between the blue organic light-emitting material layer 242 and the red-green organic light-emitting material layer 245, a total thickness thereof is within a range of 50-60 nm, and a refractive index thereof is within a range of 1.7 to 1.9. The second electron transport layer 246 is arranged between the red-green organic light-emitting material layer 245 and the cathode layer 25, and a thickness thereof is within a range of 30-50 nm. The above-mentioned organic materials are all highly transparent materials having very small extinction coefficients, their refractive indexes are all within a range of 1.7 to 2.0, and a transmittance thereof is more than 98% in a visible light region. Meanwhile, a thickness of the micro cavity modulation layer 231 corresponding to the first type sub-pixel is within a range of 110-125 nm, a thickness of the micro cavity modulation layer 232 corresponding to the second type sub-pixel is within a range of 65-75 nm, and a thickness of the micro cavity modulation layer 233 corresponding to the third type sub-pixel is within a range of 18-25 nm.

The above-mentioned layer thicknesses and material refractive indexes are put into the formula (1), similar to Embodiment 1, light of the sub-pixels displaying different colors can all be enhanced, stray light of other wavelengths is suppressed, and the color purity is increased. For the first type sub-pixel 261, that is, the sub-pixel displaying the red color, an enhanced output of light of approximately 620 nm and 410 nm can be obtained. For the second type sub-pixel 262, that is, the sub-pixel displaying the green color, an enhanced output of light of approximately 530 nm can be obtained. For the third type sub-pixel 263, that is, the sub-pixel displaying the blue color, an enhanced output of light of approximately 460 nm can be obtained.

For the top-emission type micro cavity OLED display device provided by the present invention, the organic light-emitting material layer is a non-patterned continuous full-surface structure, and color displaying is achieved by setting cavity lengths of micro cavities of different sub-pixels. Compared with the related art in which red, green and blue sub-pixels are juxtaposed, since a fine mask technology is not required for patterning the red, green, and blue light-emitting materials to be formed on the substrate, it is not limited by the fine mask technology, and thus a display effect of a higher resolution can be achieved. Moreover, the present invention is based on the principle of multi-beam interference of the micro cavity, by setting a layer thickness and a material reflectivity in the micro cavity, the output intensity and color purity of the red, green and blue light can be increased, and an excellent color display effect can be achieved. Moreover, the top-emission type micro cavity OLED display device provided by the present invention may not be provided with the color filter layer, and has advantages of low power consumption and high efficiency. Furthermore, the top-emission type micro cavity OLED display device provided by the present invention may further include an anode modulation layer that functions to provide holes while serving as an optical modulation layer, and the anode modulation layer functions as both an anode of the sub-pixel and an optical modulation layer of the sub-pixel, thereby having a simple structure.

The present application is intended to cover any variations, uses, or adaptive changes of the present invention, which are in accordance with a general principle of the present invention and include common knowledge or conventional technical means in the art that are not disclosed in the present invention. The specification and embodiments are to be considered illustrative only, and the actual scope and spirit of the present invention are defined by the claims below. It should be understood that the present invention is not limited to the precise structures that have been described above and shown in the figures, and various modifications and changes can be made without departing from the scope thereof. The scope of the present invention is defined merely by the appended claims.

What is claimed is:

1. A top-emission type micro cavity OLED display device, comprising: an array substrate, a reflection metal layer arranged on the array substrate, an anode modulation layer arranged on the reflection metal layer, an organic light-emitting layer arranged on the anode modulation layer, and a cathode layer arranged on the organic light-emitting layer; wherein the organic light-emitting layer is not patterned, and the anode modulation layer is a translucent conductive material;

wherein the top-emission type micro cavity OLED display device comprises a plurality of sub-pixels, and the anode modulation layer is divided into a plurality of anode modulation electrodes corresponding to the plurality of sub-pixels; the plurality of sub-pixels is at least classified into a first type sub-pixel, a second type sub-pixel and a third type sub-pixel; the first type sub-pixel, the second type sub-pixel, and the third type sub-pixel display different colors, and the anode modulation electrodes corresponding to the first type sub-pixel, the second type sub-pixel, and the third type sub-pixel have different thicknesses.

2. The top-emission type micro cavity OLED display device according to claim 1, wherein the first type sub-pixel displays a red color, the second type sub-pixel displays a green color, and the third type sub-pixel displays a blue color; a thickness of the anode modulation electrode corresponding to the first type sub-pixel is greater than a thickness of the anode modulation electrode corresponding to the second type sub-pixel, and the thickness of the anode modulation electrode corresponding to the second type sub-pixel is greater than a thickness of the anode modulation electrode corresponding to the third type sub-pixel.

3. The top-emission type micro cavity OLED display device according to claim 2, wherein a sum of a thickness of the organic light-emitting layer corresponding to the first type sub-pixel and the thickness of the anode modulation electrode corresponding to the first type sub-pixel is within a range of 290-310 nm, a sum of a thickness of the organic light-emitting layer corresponding to the second type sub-pixel and the thickness of the anode modulation electrode corresponding to the second type sub-pixel is within a range of 240-260 nm, and a sum of a thickness of the organic light-emitting layer corresponding to the third type sub-pixel and the thickness of the anode modulation electrode corresponding to the third type sub-pixel is within a range of 190-210 nm.

4. The top-emission type micro cavity OLED display device according to claim 3, wherein the thickness of the anode modulation electrode corresponding to the first type sub-pixel is within a range of 110-125 nm, the thickness of the anode modulation electrode corresponding to the second type sub-pixel is within a range of 65-75 nm, and the thickness of the anode modulation electrode corresponding to the third type sub-pixel is within a range of 18-25 nm.

5. The top-emission type micro cavity OLED display device according to claim 4, wherein the organic light-emitting layer comprises a first hole transport layer, a blue organic light-emitting material layer, a first electron transport layer, a second hole transport layer, a red-green organic light-emitting material layer, and a second electron transport layer that are sequentially arranged on the anode modulation layer.

6. The top-emission type micro cavity OLED display device according to claim 5, wherein a thickness of the first hole transport layer is within a range of 10-30 nm, a thickness of the blue organic light-emitting material layer is within a range of 20-35 nm, a sum of a thickness of the first electron transport layer and a thickness of the second hole transport layer is within a range of 50-60 nm, a thickness of the red-green organic light-emitting material layer is within a range of 25-35 nm, a thickness of the second electron transport layer is within a range of 30-50 nm; refractive indexes of the first hole transport layer, the blue organic light-emitting material layer, the first electron transport layer, the second hole transport layer, the red-green organic light-emitting material layer, and the second electron transport layer are within a range of 1.7 to 1.9.

7. The top-emission type micro cavity OLED display device according to claim 2, wherein a red filter layer is correspondingly provided on the first type sub-pixel.

8. The top-emission type micro cavity OLED display device according to claim 1, wherein a material of the anode modulation layer is indium tin oxide.

9. A top-emission type micro cavity OLED display device, comprising: an array substrate, a reflection anode layer arranged on the array substrate, a micro cavity modulation layer arranged on the reflection anode layer, an organic light-emitting layer arranged on the micro cavity modulation layer, and a cathode layer arranged on the organic light-emitting layer; wherein the organic light-emitting layer is not patterned, wherein the top-emission type micro cavity OLED display device comprises a plurality of sub-pixels, and the plurality of sub-pixels is at least classified into a first type sub-pixel, a second type sub-pixel and a third type sub-pixel; the first type sub-pixel displays a red color, the second type sub-pixel displays a green color, and the third type sub-pixel displays a blue color; and wherein the micro cavity modulation layer has different thicknesses corresponding to the first type sub-pixel, the second type sub-pixel, and the third type sub-pixel; and a sum of a thickness of the organic light-emitting layer corresponding to the first type sub-pixel and a thickness of the micro cavity modulation layer corresponding to the first type sub-pixel is within a range of 290-310 nm, a sum of a thickness of the organic light-emitting layer corresponding to the second type sub-pixel and a thickness of the micro cavity modulation layer corresponding to the second type sub-pixel is within a range of 240-260 nm, and a sum of a thickness of the organic light-emitting layer corresponding to the third type sub-pixel and a thickness of the micro cavity modulation layer corresponding to the third type sub-pixel is within a range of 190-210 nm.

10. The top-emission type micro cavity OLED display device according to claim 9, wherein the thickness of the micro cavity modulation layer corresponding to the first type sub-pixel is within a range of 110-125 nm, the thickness of the micro cavity modulation layer corresponding to the second type sub-pixel is within a range of 65-75 nm, and the thickness of the micro cavity modulation layer corresponding to the third type sub-pixel is within a range of 18-25 nm.

11. The top-emission type micro cavity OLED display device according to claim 10, wherein the organic light-emitting layer comprises a first hole transport layer, a blue organic light-emitting material layer, a first electron transport layer, a second hole transport layer, a red-green organic light-emitting material layer, and a second electron transport layer that are sequentially arranged on the micro cavity modulation layer.

12. The top-emission type micro cavity OLED display device according to claim 11, wherein a thickness of the first hole transport layer is within a range of 10-30 nm, a thickness of the blue organic light-emitting material layer is within a range of 20-35 nm, a sum of a thickness of the first electron transport layer and a thickness of the second hole transport layer is within a range of 50-60 nm, a thickness of the red-green organic light-emitting material layer is within a range of 25-35 nm, and a thickness of the second electron transport layer is within a range of 30-50 nm; and refractive indexes of the first hole transport layer, the blue organic light-emitting material layer, the first electron transport layer, the second hole transport layer, the red-green organic light-emitting material layer, and the second electron transport layer are within a range of 1.7 to 1.9.

13. The top-emission type micro cavity OLED display device according to claim 12, wherein a red filter layer is correspondingly provided on the first type sub-pixel.

14. A top-emission type micro cavity OLED display device, comprising: an array substrate, a reflection layer arranged on the array substrate, an anode layer arranged on the reflection layer, a micro cavity modulation layer arranged on the anode layer, an organic light-emitting layer arranged on the micro cavity modulation layer, and a cathode layer arranged on the organic light-emitting layer; wherein the organic light-emitting layer is not patterned and the organic light-emitting layer comprises a plurality of layers;

wherein the top-emission type micro cavity OLED display device comprises a plurality of sub-pixels, and the plurality of sub-pixels is at least classified into a first type sub-pixel, a second type sub-pixel, and a third type sub-pixel; and the first type sub-pixel displays red light, the second type sub-pixel displays green light, the third type sub-pixel displays blue light, and the micro cavity modulation layer has different thicknesses corresponding to the first type sub-pixel, the second type sub-pixel, and the third type sub-pixel;

wherein wavelengths of light emitted by the first type sub-pixel, light emitted by the second type sub-pixel, and light emitted by the third type sub-pixel satisfy the following formula: $\Sigma 2n_i d_i + \delta_k = k\lambda$; and wherein $n_i$ is a refractive index of a material of an $i^{th}$ layer of the plurality of layers of the organic light-emitting layer and the micro cavity modulation layer; $d_i$ is a thickness of the $i^{th}$ layer of the plurality of layers of the organic light-emitting layer and the micro cavity modulation layer; $\delta_k$ is a metal phase shift; and k is 1, 2, or 3.

15. The top-emission type micro cavity OLED display device according to claim 14, wherein the reflection layer and the anode layer are of a same layer that is made of a metal reflective material.

16. The top-emission type micro cavity OLED display device according to claim 14, wherein the anode layer and the micro cavity modulation layer are of a same layer that is made of a translucent conductive material.

* * * * *